Figure 1:
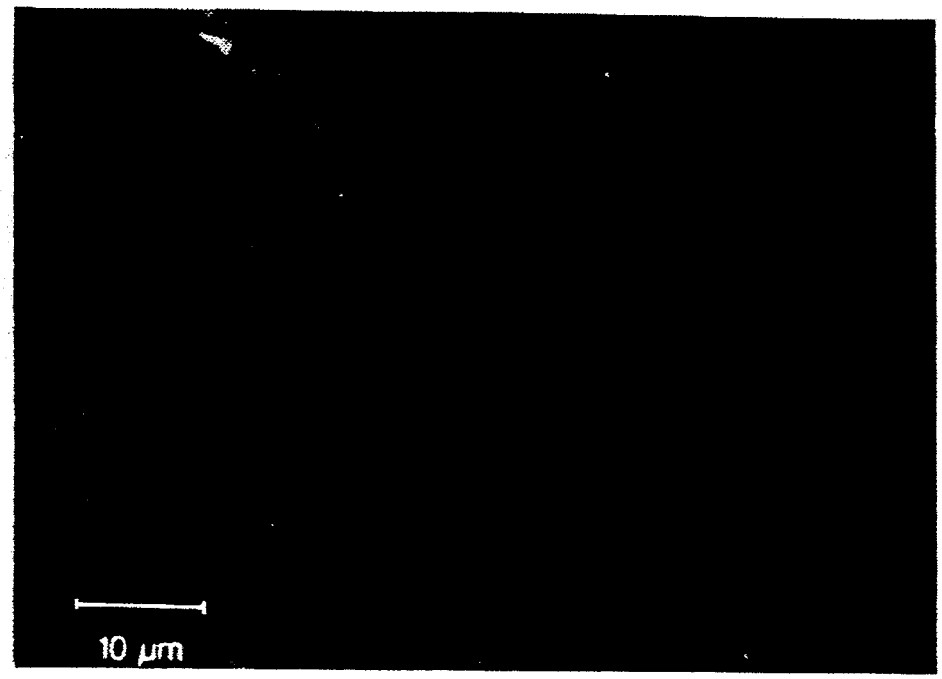

United States Patent [19]

Schwarz et al.

[11] Patent Number: 5,200,387
[45] Date of Patent: Apr. 6, 1993

[54] SUPERCONDUCTING MATERIALS OF HIGH DENSITY AND CRYSTALLINE STRUCTURE PRODUCED FROM A MIXTURE OF $YBA_2CU_3O_{7-x}$ AND CUO

[75] Inventors: Martin Schwarz, Königstein/Taunus; Iris Küllmer, Frankfurt am Main, both of Fed. Rep. of Germany

[73] Assignee: Hoechst Aktiengesellschaft, Frankfurt am Main, Fed. Rep. of Germany

[21] Appl. No.: 553,746

[22] Filed: Jul. 17, 1990

[30] Foreign Application Priority Data

Jul. 19, 1989 [DE] Fed. Rep. of Germany ....... 3923845

[51] Int. Cl.$^5$ .................... H01B 12/00; C01G 3/02
[52] U.S. Cl. ........................ 505/1; 505/776; 505/779; 505/780; 252/521; 423/593
[58] Field of Search .............. 505/1, 776, 779, 780; 252/521; 423/593

[56] References Cited

U.S. PATENT DOCUMENTS

| | | | |
|---|---|---|---|
| 4,952,390 | 8/1990 | Takei et al. | 505/1 |
| 4,956,336 | 9/1990 | Salama et al. | 505/1 |
| 4,962,084 | 10/1990 | deBarbadillo, II et al. | 505/1 |

FOREIGN PATENT DOCUMENTS

| | | |
|---|---|---|
| 0283620 | 9/1988 | European Pat. Off. |
| 0300353 | 1/1989 | European Pat. Off. |
| 3817319 | 5/1988 | Fed. Rep. of Germany |

OTHER PUBLICATIONS

Karpinski et al., "Two New Bulk Superconducting Phases in the Y-Ba-Cu-O System:," *Jrnl. Less Common Metals* vol. 150, pp. 129-137 (1989).

Bordet et al., "Structure Determination of the New High Temperature Superconductor $Y_2 Ba_4Cu_7 O_{14+x}$," *Letter to Nature* vol. 334, Aug. 18, 1988.

Hamdi et al., "Grain Growth of Rapid-Thermal-Annealed Y-Ba-Cu Oxide Superconducting Thin Films," *Appl. Phys. Lett.* vol. 53, No. 5, Aug. 1, 1988.

Karpinski; Rusieki et al., "Phase Diagrams of $YBa_2Cu_4O_8$ and $YBa_2Cu_{3.5}O_{7.5}$ In . . . ," *Physical* (vol. 160, pp. 449-457 (1989).

Blendell et al., "Relationship of Electrical, Magnetic and Mechanical Properties to Processing in High Temperature Superconductors," *ACS* Symp. Series, Chem. High Tc Supercond. 1987.

Rao et al., "Superconductivity Studies on the High Tc Phase in the Y-Ba-Cu-O System," *JJAP* vol. 26, Supplement 26-3, 1987.

*Primary Examiner*—A. Lionel Clingman
*Assistant Examiner*—Bradley A. Swope
*Attorney, Agent, or Firm*—Curtis, Morris & Safford

[57] ABSTRACT

A compact superconductor of the empirical composition $YBa_2Cu_3O_{7-x} \times zCuO$, in which z is a number from 0.08 to 0.84, consists of elongated crystals grown together irregularly. It has a density of at least 5.9 g/cm$^3$, in particular at least 6.02 g/cm$^3$. It is prepared by mixing a fine-grained superconductor powder of the composition $YBa_2Cu_3O_{7-x}$ with 1 to 10% by weight of CuO, compressing the mixture under a pressure of at least 1 MPa to give a compact, and heating this compact at 940°-985° C. for at least 5 hours.

6 Claims, 4 Drawing Sheets

SUPERCONDUCTING MATERIALS OF HIGH DENSITY AND CRYSTALLINE STRUCTURE PRODUCED FROM A MIXTURE OF YBA$_2$CU$_3$O$_{7-x}$ AND CUO

The present invention relates to compact oxide ceramic superconducting materials of the YBa$_2$Cu$_3$O$_{7-x}$ having an advantageous structure of the crystallites and to a process for their preparation.

The recently discovered high-temperature superconducting compounds based on Y—Ba—Cu—O, Bi—Sr—Ca—Cu—O or Tl—Ba—Ca—Cu—O promise to provide a large number of attractive applications by virtue of their high critical temperatures T$_c$. Their disadvantage is that the currentcarrying capacity which is crucial for applications of a compact material (i.e. which is not in the form of thin films) has only low values. Possible reasons for this, apart from impurities at the grain boundaries (weak links), is in particular the fact that these superconductors have a layered crystal structure, resulting in an anisotropy of important physical properties. For example, in single crystals of YBa$_2$Cu$_3$O$_{7-x}$ it has been found that under the conditions of superconduction, currents flow only in one plane which is perpendicular to the lattice axis c. The current flow is therefore better if the individual crystals are needle-shaped.

Accordingly, the object of the invention was to produce compact superconductors in which at least the crystalline regions are needle-shaped.

This object is achieved by means of the invention. It is based on the finding that upon sintering a superconductor, powder of the composition YBa$_2$Cu$_3$O$_{7-x}$, the additive CuO promotes the formation of textured samples (i.e. samples in which the single crystal lamellas are aligned parallel) and these samples have a particularly high density.

The invention relates to compact superconductors of the empirical composition YBa$_2$Cu$_3$O$_{7-x}\times$zCuO, in which z is a number from 0.08 to 0.84, which consist of elongated crystals irregularly grown together and have a density of at least 5.9 g/cm$^3$. The additive CuO seems to improve the favorable properties of the superconductor slightly; however, it is required in particular for achieving an elongated structure of the individual crystalline regions.

However, if a fine YBa$_2$Cu$_3$O$_{7-x}$ powder is sintered to give compact materials in the absence of additives, their structure is completely irregular with respect to size and shape and orientation of the grains. In particular, the grains consist of small, irregularly formed crystalline regions, including amorphous regions. Without the addition of foreign substances, sintered specimens of densities of up to 98% of theoretical density are obtained, as long as a certain sintering method (cf. Example 1 but without CuO) is maintained.

The content of the additive copper oxide is in particular 0.16–0.50 mole per mole of YBa$_2$Cu$_3$O$_{7-x}$. With these kinds of additives, the crystals of the superconductors have a ratio of length/diameter of on average 3:1–10:1.

The superconductors according to the invention can be prepared by mixing fine grains of a conductor powder of the composition YBa$_2$Cu$_3$O$_{7-x}$ with 1 to 10% by weight of copper oxide, compacting the mixture under a pressure of at least 1 MPa and heating it for 1 hour, even better for at least 5 hours, at 940° to 985° C., in particular 950 to 975° C. for sintering. Particularly regular anisotropic crystals are formed with additives of 2–6% by weight of CuO. The empirical composition of the product obtained corresponds to that of the starting mixture.

Surprisingly, the density of the materials thus prepared is particularly high. The density of superconducting compacts according to the invention of the composition YBa$_2$Cu$_3$O$_{7-x}\times$zCuO is at least 95%, in most cases at least 98%, of the theoretical density of 6.344. In general, compact moldings having a density of 6.02–6.22 g/cm$^3$, which corresponds to 95-98% of theory, are formed. This high density results in a particularly high tolerance of the materials for mechanical stress.

The process mentioned allows for the first time the preparation of samples of particularly high density (greater than 98%, in particular 98–99%, of the theoretical density) in a relatively broad temperature range. Thus, the range for the sintering temperature, which should not be exceeded, is 950°–980° C., particularly advantageously 970° to 980° C. The added CuO should be very finely ground. An average particle size of no more than 100 μm is advantageous. Independent of the proportion of added CuO, YBa$_2$Cu$_3$O$_{7-x}$ powder and the sintering method chosen, the densities of the samples are higher if finely ground CuO is used instead of coarse CuO.

An alternative preparation process starts with a mixture of the starting components, which leads to the formation of a superconductor, such as, for example, of the corresponding metal oxide, metal carbonate or metal nitrate, to which an excess of CuO has been added and which is reacted in an analogous fashion. During this process, a liquid molten phase almost always occurs in at least some portions of the mixture. This liquid molten phase is probably responsible for the formation of continuous crystalline regions. This sintering by heating lasts at least two hours, preferably at least 10, in particular at least 20 hours.

In all cases, it is advantageous to carry out the heating in an atmosphere which contains free oxygen. It is furthermore advantageous if the material is cooled after the sintering to a temperature of 400° C. or higher, at which no more liquid phase is present, for example to temperatures of 880° to 900° C., and kept at this temperature in the presence of an oxygen-containing atmosphere for at least one hour, but preferably at least 5 hours. Particularly preferably, the duration of the heating in both steps is in the range from 10 to 20 hours, preferably 15 hours.

The products obtained by this process have better superconducting properties than samples without CuO. Thus, the critical temperatures are in the range around 90° K., i.e. about 4° K. higher than in samples without CuO. The current-carrying capacity is also good.

The invention will be illustrated in more detail by means of the examples and the accompanying figures (obtained with linear polarized light, magnification 460 and 1,700).

EXAMPLE 1

Fine-grained YBa$_2$Cu$_3$O$_{7-x}$ powder is mixed with 2% of CuO (fine powder), compressed to compacts under a pressure of about 300 MPa (3 kbar) and sintered in air as follows:

Heating to 975° C. over a period of 10 hours
Annealing at 975° C. for 20 hours

Cooling to 400° C. over a period of 10 hours
Annealing at 400° C. for 15 hours
Cooling to room temperature (=RT) over a period of 4 hours
Result:
Density: 6.32 g/cm$^3$ (99.6% of theoretical density)
Tc: 90° K.
Average grain length: e=35 μm
Average grain width: d=4 μm
A photograph of the structure is shown in FIG. 1. The figure shows several single crystal lamellas composed of HTSL material, which are, however, aligned parallel to one another only to a small extent.

EXAMPLE 2

Figure 2:
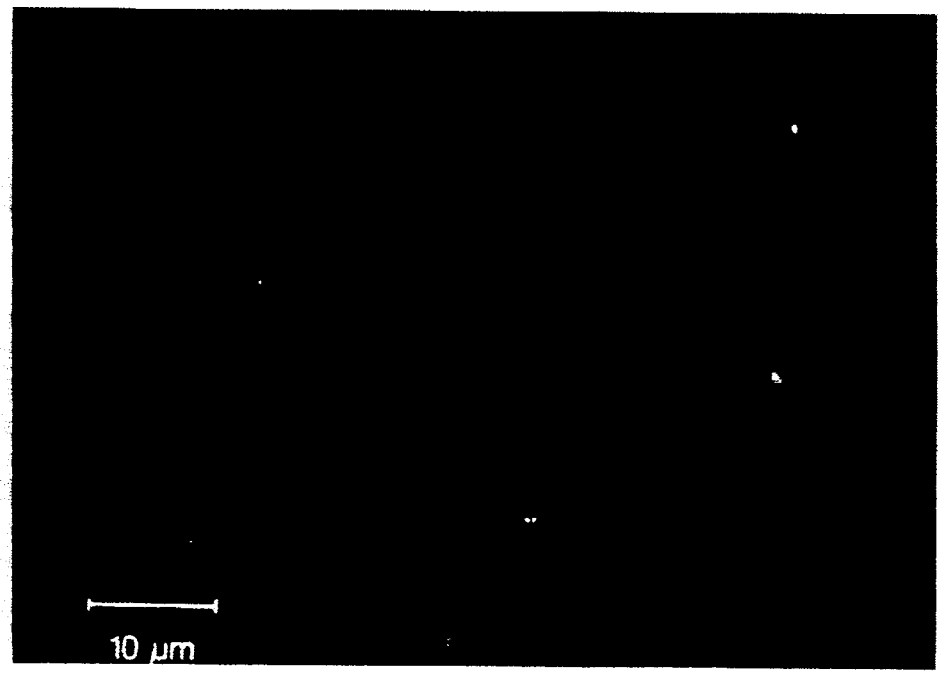

Fine-grained $YBa_2Cu_3O_{7-x}$ powder is processed together with 5% of CuO (fine powder), as in Example 1, to give a green compact, which is sintered as follows:
Heating to 975° C. over a period of 10 hours
Annealing at 975° C. for 20 hours
Cooling to 400° C. over a period of 10 hours
Annealing at 400° C. for 15 hours
Cooling to RT over a period of 5 hours
Result:
Density: 6.33 g/cm$^3$ (99.7% of theoretical density)
Tc: 90° K.
e=40 μm
d=4 μm
A photograph of the structure is shown in FIG. 2. The figure shows that the single crystalline regions have a narrower and more elongated shape and also show more parallel alignment than in Example 1.

EXAMPLE 3

Figure 3:
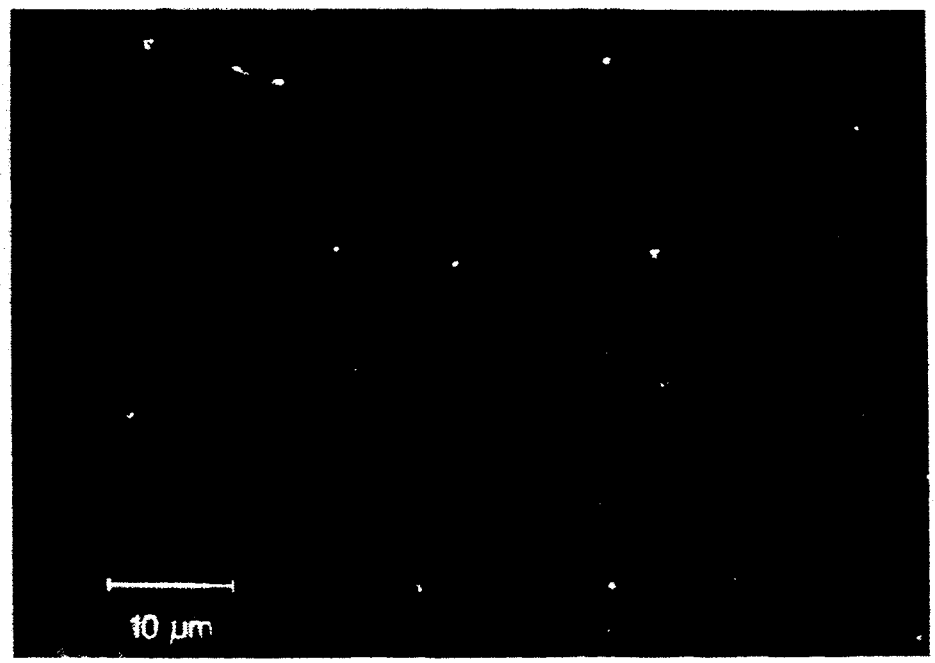

Fine-grained $YBa_2Cu_3O_{7-x}$ powder is processed together with 10% of CuO (fine powder), as in Example 1, to give a green compact, which is sintered as follows:
Heating to 975° C. over a period of 10 hours
Annealing at 975° C. for 20 hours
Cooling to 400° C. over a period of 10 hours
Annealing at 400° C. for 15 hours
Cooling to RT over a period of 5 hours
Result:
Density: 6.32 g/cm$^3$ (99.6% of theoretical density)
Tc: 88° K.
e=35 μm
d=5 μm
A photograph of the structure is shown in FIG. 3. It is true that the HTSL crystals are nicely crystallized, but they do not show parallel alignment. Reasons: a portion of the additive CuO is precipitated between the HTSL crystals and prevents their contact with one another.

EXAMPLE 4

Figure 4:

Fine-grained $YBa_2Cu_3O_{7-x}$ powder is processed together with 5% of CuO (fine powder), as in Example 1, to give a green compact, which is sintered as follows:
Heating to 950° C. over a period of 10 hours
Annealing at 950° C. for 20 hours
Cooling to 400° C. over a period of 10 hours
Annealing at 400° C. for 15 hours
Cooling to RT over a period of 5 hours
Result:
Density: 6.30 g/cm$^3$ (99.3% of theoretical density)
Tc: 90° K.
e=30 μm
d=5 μm A photograph of the structure is shown in FIG. 4. Comparison with Example 2 (sintering temperature about 975° C.) shows that the formation of larger single crystal, elongated regions and their parallel alignment takes place in a characteristic temperature range, which was not maintained in this case. In this example, crystals have a very small area, hardly show a preferential orientation and are not aligned parallel to one another.

EXAMPLE 5

Figure 5:
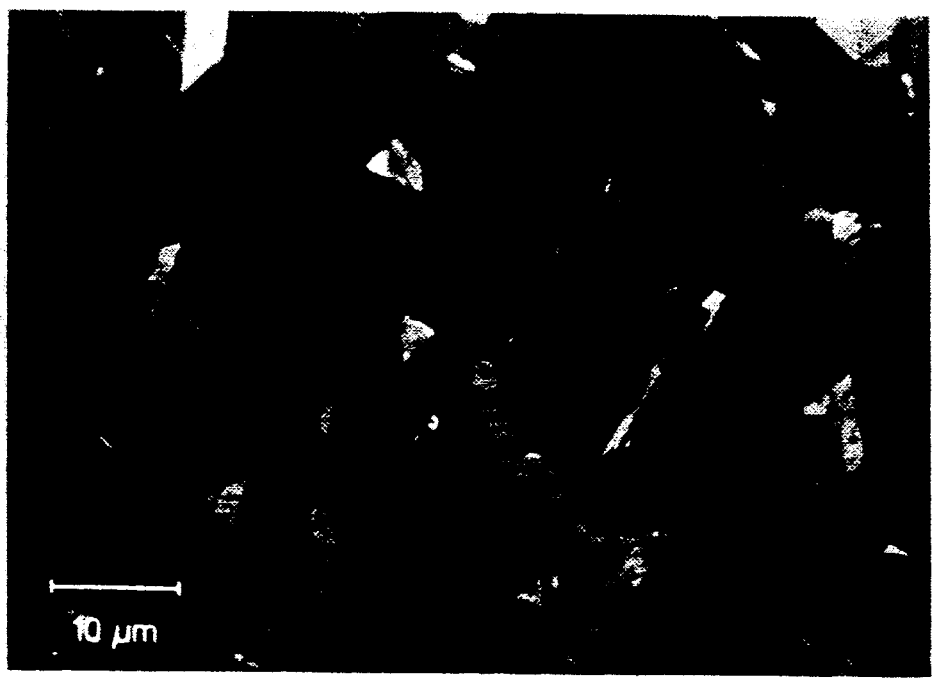

A fined-grained $YBa_2Cu_3O_{7-x}$ powder is processed together with 5% of CuO (fine powder), as in Example 1, to give a green compact, which is sintered as follows:
Heating to 975° C. over a period of 10 hours
Annealing at 975° C. for 10 hours
Cooling to 400° C. over a period of 10 hours
Annealing at 400° C. for 15 hours
Cooling to RT over a period of 5 hours
Result:
Density: 6.33 g/cm$^3$ (199.7% of theoretical density)
Tc: 88° K.
e=40 μm
d=4 μm
A photograph of the structure is shown in FIG. 5. The procedure is as in Example 2. The holding time at the maximum temperature was reduced to half. Nevertheless, the structure corresponds to that of Example 2. This shows that the formation of the crystalline structure is a relatively rapid process and is completed after a few hours.

EXAMPLE 6 (COMPARATIVE EXAMPLE)

Figure 6:
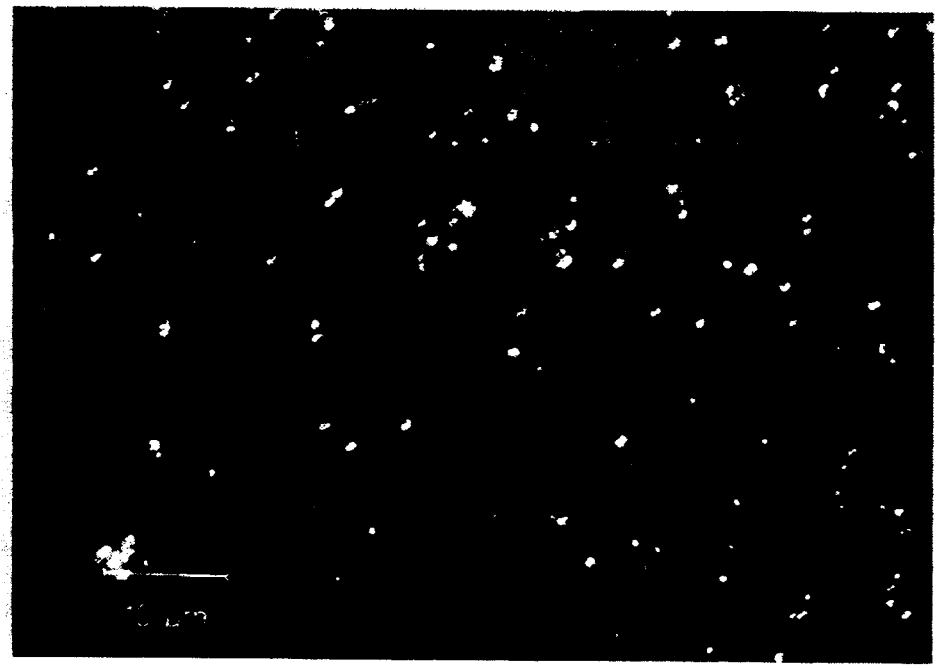

Fine-grained $YBa_2Cu_3O_{7-x}$ powder is processed with 5% of CuO (coarse powder) as in Example 5 to give a sintered material.
Result:
Density: 5.58 g/cm$^3$ (88% of theoretical density)
Tc: 88° K.
e=30 μm
d=5 μm
A photograph of the structure is shown in FIG. 6. It shows that the size and parallel alignment of the individual crystals is less than in the comparison sample which contains fine powdered CuO. This photograph of the structure shows that the structuring effect of CuO is not only a function of the percentage of the additive or the temperature program, but also depends upon whether CuO is added as a fine-grained or—as in this case—as a coarse-crystalline powder.

EXAMPLE 7 (COMPARATIVE EXAMPLE)

Figure 7:
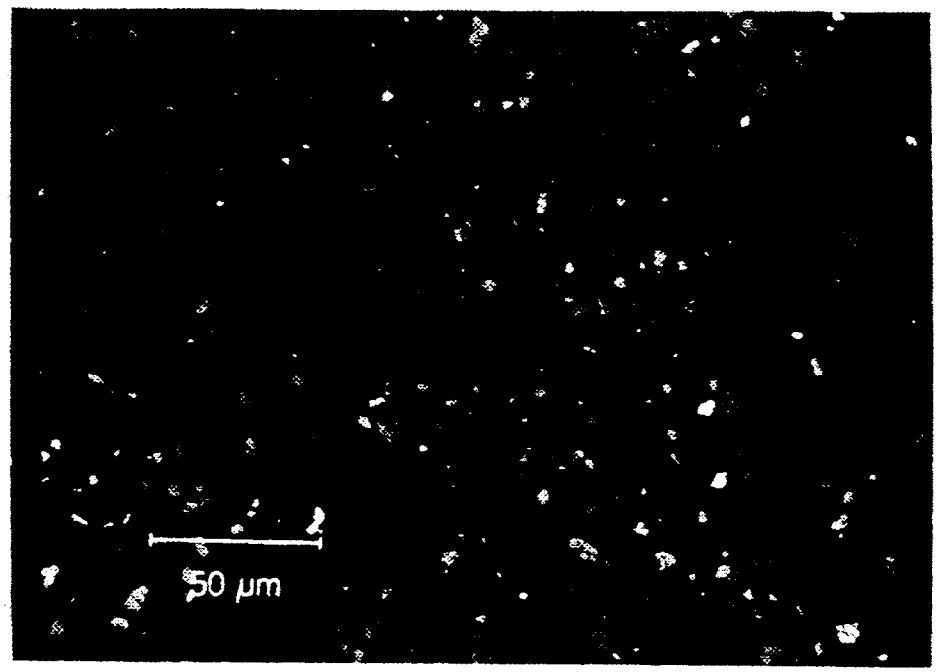

Fine-grained powder ($YBa_2Cu_3O_{7-x}$) is processed without additive as in Example 5 to give a sintered material. However, the annealing time at 975° C. is 20 hours.
Result:
Density: 6.23 g/cm$^3$ (98.2% of theoretical density)
Tc: 60° K.
A photograph of the structure is shown in FIG. 7. The structure contains small crystals, is porous, and the crystals have no preferred orientation.

We claim:
1. A process for the preparation of a superconductor of the empirical composition $YBa_2Cu_3O_{7-x} \times zCuO$, in which z is a number from 0.08 to 0.84, which consists of elongated crystals grown together irregularly and has a density of at least 5.9 g/cm$^3$ and a critical temperature of about 88° to about 90° K., wherein a fine-grained superconductor powder of the composition $YBa_2Cu_3O_{7-x}$ is mixed with 1 to 10% by weight of fined-grained CuO, wherein the CuO has an average particle size of no more than 100 μm, the mixture is compacted under a pressure-released 1 MPa, and the resulting compact is heated at 940°–985° C. for at least 5 hours.

2. A process for the preparation of a superconductor as claimed in claim 1, wherein the ratio of length/diameter in the crystals of the superconductor is on average 3:1 to 10:1.

3. A process for the preparation of a superconductor as claimed in claim 1, wherein the superconductor has a density of 6.00 to 6.33 $g/cm^3$.

4. The process as claimed in claim 1, wherein the heating is carried out in an atmosphere which contains free oxygen.

5. A process for the preparation of a superconductor as claimed in claim 1, wherein the superconductor has a density of at least 6.02 $g/cm^3$.

6. A process for the preparation of a superconductor as claimed in claim 1, wherein the compact is heated at 950°–975° C.

* * * * *